United States Patent
Yu et al.

(10) Patent No.: US 8,522,064 B2
(45) Date of Patent: Aug. 27, 2013

(54) SERVER SYSTEM HAVING MAINBOARDS

(75) Inventors: Xiong-Jie Yu, Shanghai (CN); Tsu-Cheng Lin, Taipei (TW)

(73) Assignee: Inventec Corporation, Taipei (TW)

( * ) Notice: Subject to any disclaimer, the term of this patent is extended or adjusted under 35 U.S.C. 154(b) by 397 days.

(21) Appl. No.: 12/943,947

(22) Filed: Nov. 11, 2010

(65) Prior Publication Data
US 2012/0030492 A1 Feb. 2, 2012

(30) Foreign Application Priority Data
Jul. 27, 2010 (CN) .......................... 2010 1 0240446

(51) Int. Cl.
*G06F 1/00* (2006.01)
*G06F 13/00* (2006.01)
(52) U.S. Cl.
USPC ........................... 713/324; 713/300; 710/301
(58) Field of Classification Search
None
See application file for complete search history.

(56) References Cited

U.S. PATENT DOCUMENTS

| | | | |
|---|---|---|---|
| 2006/0194460 A1* | 8/2006 | Chen et al. | 439/108 |
| 2008/0232974 A1* | 9/2008 | Tsuchiya | 417/14 |
| 2009/0217060 A1* | 8/2009 | Tsuchiya | 713/300 |
| 2011/0191514 A1* | 8/2011 | Wu et al. | 710/301 |

FOREIGN PATENT DOCUMENTS

| | | |
|---|---|---|
| CN | 1403892 A | 3/2003 |
| CN | 1786935 A | 6/2006 |
| CN | 101727128 A | 6/2010 |

* cited by examiner

*Primary Examiner* — Kim Huynh
*Assistant Examiner* — Vincent Chang
(74) *Attorney, Agent, or Firm* — CKC & Partners Co., Ltd.

(57) ABSTRACT

The present invention provides a server system comprising a first group of mainboard modules and a second group of mainboard modules, each of the first and second groups of mainboard modules including a plurality of mainboard modules. Each mainboard module includes a mainboard and a daughter board electrically connected to the mainboard; a first adaptor and a second adaptor; a hard disk array including a hard disk backplane and a plurality of hard disks, wherein the hard disk backplane is electrically connected to the first adaptor and the second adaptor; a first power control board and a second power control board respectively connected to at least one power supply, wherein the first power control board and the second power control board are electrically connected to the hard disk array; and a management board electrically connected to the first adaptor and the second adaptor.

14 Claims, 1 Drawing Sheet

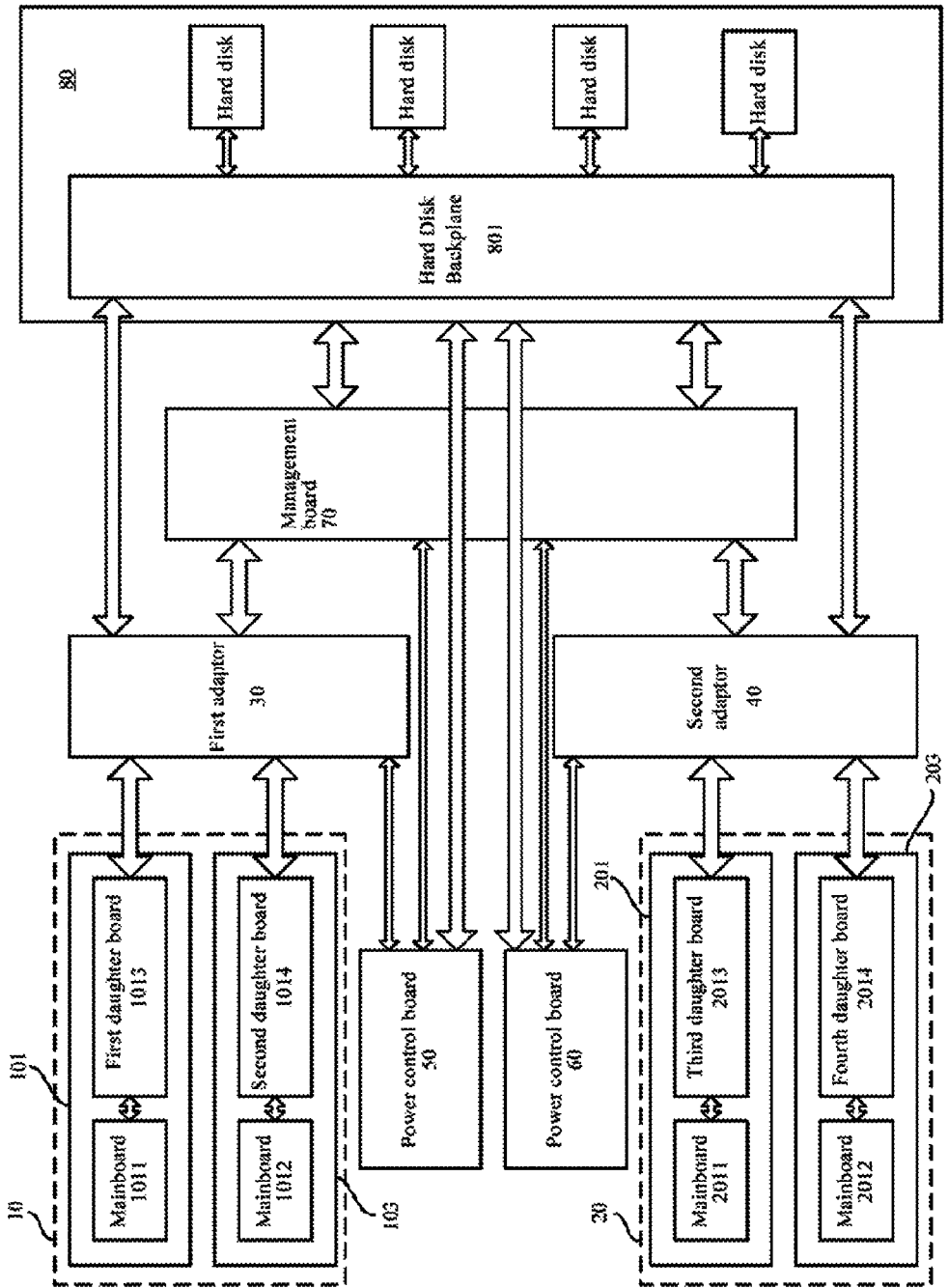

SERVER SYSTEM HAVING MAINBOARDS

RELATED APPLICATIONS

This application claims priority to China Application Serial Number 201010240446.3, filed Jul. 27, 2010, which is herein incorporated by reference.

FIELD OF INVENTION

The present invention relates to a server system. More particular, the present invention relates to a server system having a plurality of mainboards.

BACKGROUND ART

With the advance of technology and growing reliance on computer systems, the market requires higher operation capabilities and more data storage capacity for computer systems. Therefore, in order to satisfy the user requirements with respect to the specifications of computer system and data storage, a plurality of hard disks and other related components have to be arranged in a computer system. For example, a designer usually allocates many temperature sensors to measure working temperatures of hard disks and control devices such as mainboards. Meanwhile, with respect to specific values of the hard disks' temperatures, a fan with various rotation speeds has to be installed so as to increase the fan speed for rapidly dissipating heat when the working temperature of the system components is too high.

However, these mainboards, related components and hard disks are all mounted in a computer housing. For example, in a server, its housing generally has a limited space, and it is not easy to reasonably arrange these mainboards, hard disks and other components and to perform configuration optimization on the allocations of physical connections and circuit wirings in such a limited space.

In view of the above, how to develop a new server system architecture is an important issue desired to be solved by the related technical personnel.

SUMMARY OF THE INVENTION

With respect to the aforementioned disadvantages of assembling a plurality of components in the housing of the conventional server system, the present invention provides a new server system.

In one aspect, a server system is provided and includes a first group of mainboard modules and a second group of mainboard modules, a first adaptor and a second adaptor, a hard disk array (HDA), a first power control board and a second power control board, and a management board. Each of the first and second groups of mainboard modules includes a plurality of mainboard modules, and each of the mainboard modules includes a mainboard and a daughter board electrically connected to the mainboard, wherein the electrical connection of the mainboard is transferred via the daughter board. The first adaptor is electrically connected to the daughter boards of the first group of mainboard modules, and the second adaptor is electrically connected to the daughter board of the second group of mainboard modules. The HDA includes a hard disk backplane and a plurality of hard disks, wherein the hard disk backplane is electrically connected to the hard disks, and the hard disk backplane is electrically connected to the first and second adaptors. Each mainboard of the first group of mainboard modules is electrically connected to the hard disks via the daughter board, the first adaptor and the hard disk backplane, and each mainboard of the second group of mainboard modules is electrically connected to the hard disks via the daughter board, the second adaptor and the hard disk backplane. The first and second power control boards are electrically connected to at least one power supply, respectively, wherein the first power control board is electrically connected to the first adaptor, and the first group of mainboard modules receives power from the first power control board via the first adaptor, while the second power control board is electrically connected to the second adaptor, and the second group of mainboard modules receives power from the second power control board via the second adaptor, and the first and second power control boards are electrically connected to the HDA, and the hard disk backplane and the hard disks receive power from the first and second power control boards. The management board electrically connected to the first and second adaptors receives power via the first and second adaptors, and receives fan control signals sent by the mainboards of the first and second groups of mainboard modules to manage the fans in the server system with unification.

In one embodiment, the management board further receives a plurality of first ON/OFF signals, and each first ON/OFF signal is used to power on or power off one of mainboards correspondingly, and the management board sends first power control signals to the first or second power control board corresponding to the mainboard in accordance with the relationship between the first ON/OFF signals and the mainboards when it receives any of first ON/OFF signals, thereby enabling the power supply in connection with the first power control board or the second power control board to start or stop supplying power so as to power on or power off the corresponding mainboard.

In another embodiment, when receiving any of the first ON/OFF signals, the management board firstly sends a second ON/OFF signal to the ma-inboard corresponding thereto, and the mainboard sends a second power control signal to the management board according to the second ON/OFF signal, and then the management board sends the first power control signal to the first or second power control board so as to enable the power supply to start or stop supplying power to the corresponding mainboard. Preferably, each mainboard includes a baseboard management controller (BMC), which generates the first ON/OFF signal.

In another embodiment, the server system further includes an ON/OFF panel module electrically connected to the management board, wherein the ON/OFF panel module includes a plurality of ON/OFF buttons, and each of the ON/OFF buttons corresponds to one of the mainboards, and the first ON/OFF signals are generated by the ON/OFF buttons. Preferably, the ON/OFF panel module includes a first ON/OFF panel and a second ON/OFF panel, wherein the first ON/OFF panel is corresponding to the mainboards connected to the first adaptor, and the second ON/OFF panel is corresponding to the mainboards connected to the second adaptor.

In one embodiment, each mainboard includes a BMC arranged to monitor a working state of the mainboard, and the BMC generates the fan control signal in accordance with the working state and sends the fan control signal to the management board. Furthermore, each mainboard further includes a plurality of first temperature sensors used to monitor temperatures of the mainboard and electrically connect to the BMC of the mainboard to transfer the temperature data to the BMC, and the fan control signal includes such temperature data. In addition, the BMC communicates with the management board via I²C bus.

In another embodiment, the HDA further includes a plurality of second temperature sensors arranged to monitor temperatures of the HDA, and the hard disk backplane electrically connects to the management board, and temperature data of the HDA are transferred to the management board via the second temperature sensors, and the management board manages the fans with unification according to the fan control signal generated by the mainboard and the temperature data of the HDA.

In another embodiment, the mainboard and the daughter board respectively include power interfaces, hard disk data interfaces and control signal interfaces accordingly, which are electrically connected via cables. Preferably, the mainboard adapter includes a gold finger which is used to electrically connect to the first adaptor or the second adaptor, and pins of the gold finger are corresponding to the pins of the power interface, hard disk data interface and control signal interface.

In another embodiment, the first or second adaptor is electrically connected to the hard disk backplane through another hard disk data interface.

In another embodiment, the hard disk backplane is electrically connected to the management board, and the management board further monitors whether the mainboards exactly exist and thus generates mainboard configuration data, and then sends the mainboard configuration data to the hard disk backplane, and the hard disk backplane dynamically assigns the relationships of the hard disks and the mainboards in accordance with the mainboard configuration data.

BRIEF DESCRIPTION OF THE DRAWINGS

These and other features of the invention will become more apparent from the following description, in which reference is made to the appended drawings, wherein:

FIG. 1 is a schematic block diagram illustrating a server system according to one embodiment of the present invention.

PREFERRED EMBODIMENTS OF THE INVENTION

One or more currently preferred embodiments have been described by way of example. It will be apparent to the skilled in the art that a number of variations and modifications can be made without departing from the scope of the invention as defined in the claims.

FIG. 1 is an exemplary structure diagram illustrating the server system according to one embodiment of the invention. As shown in FIG. 1, the server system includes a first group of mainboard modules 10 and a second group of mainboard modules 20, a first adaptor 30 and a second adaptor 40, a first power control board 50 and a second power control board 60, a management board 70 and a hard disk array 80. The first group for mainboard modules 10 includes a first mainboard module 101 and a second mainboard module 103, and the second group for mainboard modules 20 includes a third mainboard module 201 and a fourth mainboard module 203. Preferably, both of the mainboard modules 10 and 20 are formed in the same component configuration. Thus, each of the mainboard modules 101, 103, 201 and 203 includes a mainboard and a daughter board, and the electrical connection of the mainboard is transferred via the daughter board. Concretely speaking, the mainboard module 101 includes a mainboard first 1011 and a first daughter board 1013; the mainboard module 103 includes a second mainboard 1012 and a second daughter board 1014; the mainboard module 201 includes a third mainboard 2011 and a third daughter board 2013; and the mainboard module 203 includes a fourth mainboard 2012 and a fourth daughter board 2014.

According to one embodiment, each of the mainboard modules 101, 103, 201 and 203 as well as its corresponding daughter board include power interfaces, hard disk data interfaces and control signal interfaces, and these three types of interfaces on the mainboard are electrically connected to the corresponding interfaces on the daughter board via cables. Preferably, the daughter board includes a gold finger which is used to electrically connect to the adaptor, and pins of the gold finger correspond to the pins of the power interface, hard disk data interface and control signal interface of the daughter board.

In contrast, the conventional mainboard module merely has one single mainboard. However, the mainboard module of the present invention includes a mainboard and a daughter board which is connected to each other via cables, thereby effectively overcoming the signal quality problem of the conventional mainboard module caused by the limited space of one single mainboard on which the component layout and wirings are disposed, thus further reducing the sizes of the mainboard and mainboard module. In addition, through the electrical connection between the gold finger of the daughter board and the adaptor, the mainboard module can be hot-plugged in the server system.

The adaptor 30 is electrically connected to the first group for mainboard modules 10, and the adaptor 40 is electrically connected to the second group for mainboard modules 20. Specifically, the adaptor 30 is connected to the daughter board 103 of mainboard module 101 and the daughter board 1014 of mainboard module 103. Similarly, the adaptor 40 is connected to the daughter board 2013 of mainboard module 201 and the daughter board 2014 of mainboard module 203.

Additionally, the server system further includes two power control boards 50 and 60 which are electrically connected to the respective power supplies (not shown), so as to supply power for the normal operation of the server system. The power control board 50 is electrically connected to the adaptor 30, and the first group for mainboard modules 10 receives power from the power control board 50 via the adaptor 30, and the power control board 60 is electrically connected to the adaptor 40, and the second group for mainboard modules 20 receives power from the power control board 60 via the adaptor 40.

As shown in FIG. 1, the server system further includes a management board 70 which is electrically connected to the adaptors 30 and 40 as well as the power control boards 50 and 60. In particular, the management board 70 may receive power and fan control signals via the adaptor 30, and the fan control signals are generated by the mainboards 1011 and 1012 of the first group of the mainboard modules 10, and meanwhile the management board 70 may receive power and fan control signals via the adaptor 40, and the fan control signals are generated by the mainboards 2011 and 2012 of the second group of the mainboard modules 20, and thereby manage these fans with unification in the server system.

The HDA 80 includes a hard disk backplane 801 and a plurality of hard disks (not labeled), wherein the hard disk backplane 801 is electrically connected to the hard disks. The hard disk backplane 801 is further connected to the adaptor 30 and the adaptor 40. Preferably, the adaptor 30 or 40 is electrically connected to the hard disk backplane 801 by a hard disk data interface. Thus, the mainboards 1011 and 1012 of the mainboard modules 101 and 103 of the first group of mainboard modules 10 may be individually connected to these hard disks via the daughter boards 1013 and 1014, adaptor 30 and hard disk backplane 801, and the mainboards 2011 and 2012 of the mainboard modules 201 and 203 of the second group of mainboard modules 20 may be individually connected to these hard disks via the daughter boards 2013 and 2014, adaptor 40 and hard disk backplane 801. Moreover, the HDA 80 is also connected to the power control boards 50 and 60 and the management board 70, and therefore the hard disk backplane 801 and these hard disks of the HDA 80 may receive power from the power control boards 50 and 60.

In one embodiment, the HDA 80 further includes a plurality of temperature sensors so as to measure working temperatures of the HDA 80. With the connection between the hard disk backplane 801 and the management board 70, the working temperatures of the HDA 80 may be transferred to the management board 70, and then the management board 70 may manage the fans with unification in accordance with the fan control signals from the mainboards and the working temperatures of the HDA 80.

In another embodiment, the hard disk backplane 801 is electrically connected to the management board 70, and determines whether a plurality of mainboards exactly exist in the first group for mainboard modules 10 and the second group for mainboard modules 20 by using the management board 70, and generates a mainboard configuration data. With the connection relationship of the management board 70 and the hard disk backplane 801, the generated mainboard configuration data is transferred to the hard disk backplane 801, and then the hard disk backplane 801 may dynamically assign the relationships between these hard disks and the mainboards in accordance with the mainboard configuration data.

In the server system of the present invention, the management board 70 also can be used to perform the ON/OFF operation of the system. When receiving a plurality of ON/OFF signals (hereinafter referred to as first ON/OFF signals, wherein each of the ON/OFF signals is used to power on or power off one of the mainboards correspondingly), the management board 70 sends a power control signal (hereinafter referred to as a first power control signal) to the power control board 50 or 60 according to the matching relationship between the first ON/OFF signal and the mainboard, so that the power supply connected to the corresponding power control board 50 or 60 starts or stops supplying power. Preferably, when receiving any of the first ON/OFF signals, the management board 70 firstly sends a second ON/OFF signal to the mainboard, and the mainboard sends a second power control signal to the management board 70 according to the second ON/OFF signal, and thereafter the management board 70 sends the first power control signal to the corresponding power control board 50 or 60.

In one embodiment, the server system includes an ON/OFF panel module electrically connected to the management board 70, wherein the ON/OFF panel module includes a plurality of ON/OFF buttons each of which corresponds to one of the mainboards, and the ON/OFF operation of the mainboard is performed by using the first ON/OFF signal generated by the ON/OFF button. Preferably, in correspondence to the first group for mainboard modules 10 and the second group for mainboard modules 20, the ON/OFF panel module may include a first ON/OFF panel and a second ON/OFF panel, and the first ON/OFF panel is corresponding to the mainboards of the first group for mainboard modules, 10 connected to the adaptor 30, while the second ON/OFF panel is corresponding to the mainboards of the second group for mainboard modules 20 connected to the adaptor 40.

Unlike to the above embodiments, in a further embodiment of the server system, the first ON/OFF signal is sent to the management board 70 via the BMC of each mainboard, but not via the aforementioned ON/OFF panel. Besides, the BMC of each mainboard may be used to monitor the working state of the mainboard, and generate and send a fan control signal to the management board 70 in accordance with the mainboard's working state. Among the mainboards 1011, 1012, 2011 and 2012, each mainboard includes a plurality of temperature sensors used to monitor temperature of the mainboard, wherein the mainboard transfers the temperature data to the BMC disposed thereon, and the fan control signal generated by the BMC includes such temperature data. For example, the BMC communicates with the management board 70 via I$^2$C bus.

Using the electrical connections among a plurality of mainboards, the adaptor, the hard disk array, the power control board and the management board, the server system of the present invention can monitor the working temperatures of the mainboards and the hard disk array in real time, and manage the fans with unification in accordance with the fan control signals and temperature data. The aforementioned components can be assembled easily and configured and flexibly. In addition, the mainboard module of the present invention includes a mainboard and a daughter board, and both of them are connected to each other via cables, thereby significantly reducing the sizes of the mainboard and the mainboard module. Further, the mainboard module in the server system can be hot-plugged due to the gold finger of the daughter board electrically connected to the adaptor.

It will be understood that the above description of embodiments is given by way of example only. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A server system, comprising:
   a first group of mainboard modules and a second group of mainboard modules having a plurality of mainboard modules, respectively, each of the mainboard modules comprising:
      a mainboard; and
      a daughter board electrically connected to the mainboard wherein the electrical connection of the mainboards is transferred via the daughter board;
   a first adaptor and a second adaptor, wherein the first adaptor is electrically connected to the daughter boards of the first group of mainboard modules and the second adaptor is electrically connected to the daughter boards of the second group of mainboard modules;
   a hard disk array (HDA) including a hard disk backplane and a plurality of hard disks, wherein the hard disk backplane is electrically connected to the hard disks and to the first adaptor and the second adaptor, and each mainboard of the first group of mainboard modules is electrically connected to the hard disks via the daughter board corresponding thereto, the first adaptor and the hard disk backplane, and each mainboard of the second group of mainboard modules is electrically connected to the hard disks via the daughter board corresponding thereto, the second adaptor and the hard disk backplane;
   a first power control board and a second power control board electrically connected to at least one power supply, respectively, wherein the first power control board is electrically connected to the first adaptor, the first group of mainboard modules receiving power from the first power control board via the first adaptor; and the second power control board is electrically connected to the second adaptor, the second group of mainboard modules receiving power from the second power control board via the second adaptor, the first power control board and the second power control board are electrically connected to the HDA, the hard disk backplane and the hard disks receiving power from the first power control board and second power control board; and a management board electrically connected to the first adaptor and the second adaptor, wherein the management board receives power via the first adaptor and the second adaptor and receives fan control signals sent by the mainboards of the first group of mainboard modules and the second group mainboard modules to manage a plurality of fans in the server system with unification.

2. The server system according to claim 1, wherein the management board further receives a plurality of first ON/OFF signals, and each of the first ON/OFF signals is used to power on or power off one of mainboards correspondingly, and when receiving any of the first ON/OFF signals, the management board sends a first power control signal to the first power control board or the second power control board corresponding to the mainboard in accordance with the relationship between the first ON/OFF signals and the mainboards, thereby enabling the power supply in connection with the first power control board or the second power control board to start or stop supplying power so as to power on or power off the corresponding mainboard.

3. The server system according to claim 2, wherein when receiving any of the first ON/OFF signals, the management board firstly sends a second ON/OFF signal to the mainboard corresponding thereto, and the mainboard sends a second power control signal to the management board according to the second ON/OFF signal, and then the management board sends the first power control signal to the first power control board or the second power control board so as to enable the power supply to start or stop supplying power to the corresponding mainboard.

4. The server system according to claim 3, further comprising:

an ON/OFF panel module electrically connected to the management board, wherein the ON/OFF panel module comprises a plurality of ON/OFF buttons, and each of the ON/OFF buttons corresponds to one of the mainboards, and the first ON/OFF signals are generated by the ON/OFF buttons.

5. The server system according to claim 4, wherein the ON/OFF panel module comprises a first ON/OFF panel and a second ON/OFF panel, and the first ON/OFF panel is corresponding to the mainboards connected to the first adaptor, while the second ON/OFF panel is corresponding to the mainboards connected to the second adaptor.

6. The server system according to claim 3, wherein each of the mainboards comprises a baseboard management controller (BMC) from which the first ON/OFF signal is generated.

7. The server system according to claim 1, wherein each of the mainboards comprises a baseboard management controller (BMC) arranged to monitor a working state of the mainboard at which the BMC is located, and the BMC generates the fan control signal in accordance with the working state and sends the fan control signal to the management board.

8. The server system according to claim 7, wherein each of the mainboards further comprises a plurality of first temperature sensors which are used to monitor a temperature of the mainboard and are electrically connected to the BMC of the mainboard to transfer temperature data to the BMC, and the fan control signal comprises the temperature data of the mainboard.

9. The server system according to claim 7, wherein the BMC communicates with the management board via $I^2C$ bus.

10. The server system according to claim 1, wherein the HDA further comprises a plurality of temperature sensors arranged to monitor temperatures of the HDA, and the hard disk backplane is electrically connected to the management board, and temperature data of the HDA is transferred to the management board via the temperature sensors, and the management board manages the fans with unification according to the fan control signal generated by the mainboard and the temperature data of the HDA.

11. The server system according to claim 1, wherein the mainboard and the daughter board respectively comprise power interfaces, hard disk data interfaces and control signal interfaces accordingly which are electrically connected via cables.

12. The server system according to claim 11, wherein the daughter board comprises a gold finger used to electrically connect to the first adaptor or the second adaptor, and pins of the gold finger correspond to the power interfaces, the hard disk data interfaces and the control signal interfaces.

13. The server system according to claim 1, wherein the first or second adaptor is electrically connected to the hard disk backplane through a hard disk data interface.

14. The server system according to claim 1, wherein the hard disk backplane is electrically connected to the management board, and the management board further monitors whether the mainboards exist and thus generates mainboard configuration data, and then sends the mainboard configuration data to the hard disk backplane, and the hard disk backplane dynamically assigns relationships between the hard disks and the mainboards in accordance with the mainboard configuration data.

* * * * *